(12) United States Patent
Nakayama et al.

(10) Patent No.: US 8,405,356 B2
(45) Date of Patent: Mar. 26, 2013

(54) FULL CHARGE CAPACITY VALUE CORRECTION CIRCUIT, BATTERY PACK, AND CHARGING SYSTEM

(75) Inventors: Masato Nakayama, Osaka (JP); Toshiyuki Nakatsuji, Hyogo (JP); Hisashi Kameyama, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/381,580

(22) PCT Filed: Feb. 28, 2011

(86) PCT No.: PCT/JP2011/001160
§ 371 (c)(1),
(2), (4) Date: Dec. 29, 2011

(87) PCT Pub. No.: WO2011/108249

PCT Pub. Date: Sep. 9, 2011

(65) Prior Publication Data
US 2012/0105014 A1    May 3, 2012

(30) Foreign Application Priority Data

Mar. 5, 2010 (JP) ................................. 2010-049531

(51) Int. Cl.
*H02J 7/00* (2006.01)
*H02J 7/16* (2006.01)

(52) U.S. Cl. ........ 320/132; 320/134; 320/137; 320/148; 320/149

(58) Field of Classification Search .................. 320/134, 320/135, 136, 137, 148, 149, 162, 132, 122
See application file for complete search history.

(56) References Cited

U.S. PATENT DOCUMENTS

| 6,924,622 | B1 * | 8/2005 | Anbuky et al. | 320/132 |
|---|---|---|---|---|
| 6,975,095 | B2 * | 12/2005 | Ooi et al. | 320/132 |
| 8,046,181 | B2 * | 10/2011 | Kang et al. | 702/63 |
| 8,111,071 | B2 * | 2/2012 | Lim et al. | 324/434 |
| 2006/0158155 | A1 * | 7/2006 | Tamezane et al. | 320/132 |
| 2007/0188148 | A1 * | 8/2007 | Kawasumi et al. | 320/134 |

(Continued)

FOREIGN PATENT DOCUMENTS

JP  2002-325362 A  11/2002
JP  2006-177764 A  7/2006

OTHER PUBLICATIONS

International Search Report issued in International Patent Application No. PCT/JP2011/001160 dated May 31, 2011.

*Primary Examiner* — Edward Tso
*Assistant Examiner* — Alexis Boateng
(74) *Attorney, Agent, or Firm* — McDermott Will & Emery LLP

(57) ABSTRACT

A full charge capacity value correction circuit includes: a current detection portion which detects a current value in a secondary battery; a voltage detection portion which detects a terminal voltage value of the secondary battery; a capacity storage portion which stores a full charge capacity value of the secondary battery; a remaining quantity calculation portion which calculates a remaining charging quantity in the secondary battery a remaining quantity estimation portion which estimates a remaining quantity of the secondary battery and a full charge capacity value correction portion which, when an estimated remaining quantity becomes equal to a reference value set in advance, adds a difference electrical quantity, to the full charge capacity value stored in the capacity storage portion, or subtracts the difference electrical quantity from the full charge capacity value stored in the capacity storage portion based on an estimated remaining quantity and an accumulated remaining quantity.

14 Claims, 7 Drawing Sheets

U.S. PATENT DOCUMENTS

| | | | |
|---|---|---|---|
| 2008/0180062 A1* | 7/2008 | Okumura | 320/134 |
| 2008/0255783 A1* | 10/2008 | Tamai | 702/63 |
| 2010/0001693 A1* | 1/2010 | Iida et al. | 320/134 |
| 2010/0007310 A1* | 1/2010 | Kawamoto et al. | 320/134 |
| 2010/0045298 A1* | 2/2010 | Iwane et al. | 324/427 |
| 2010/0052618 A1* | 3/2010 | Inoue et al. | 320/134 |

* cited by examiner

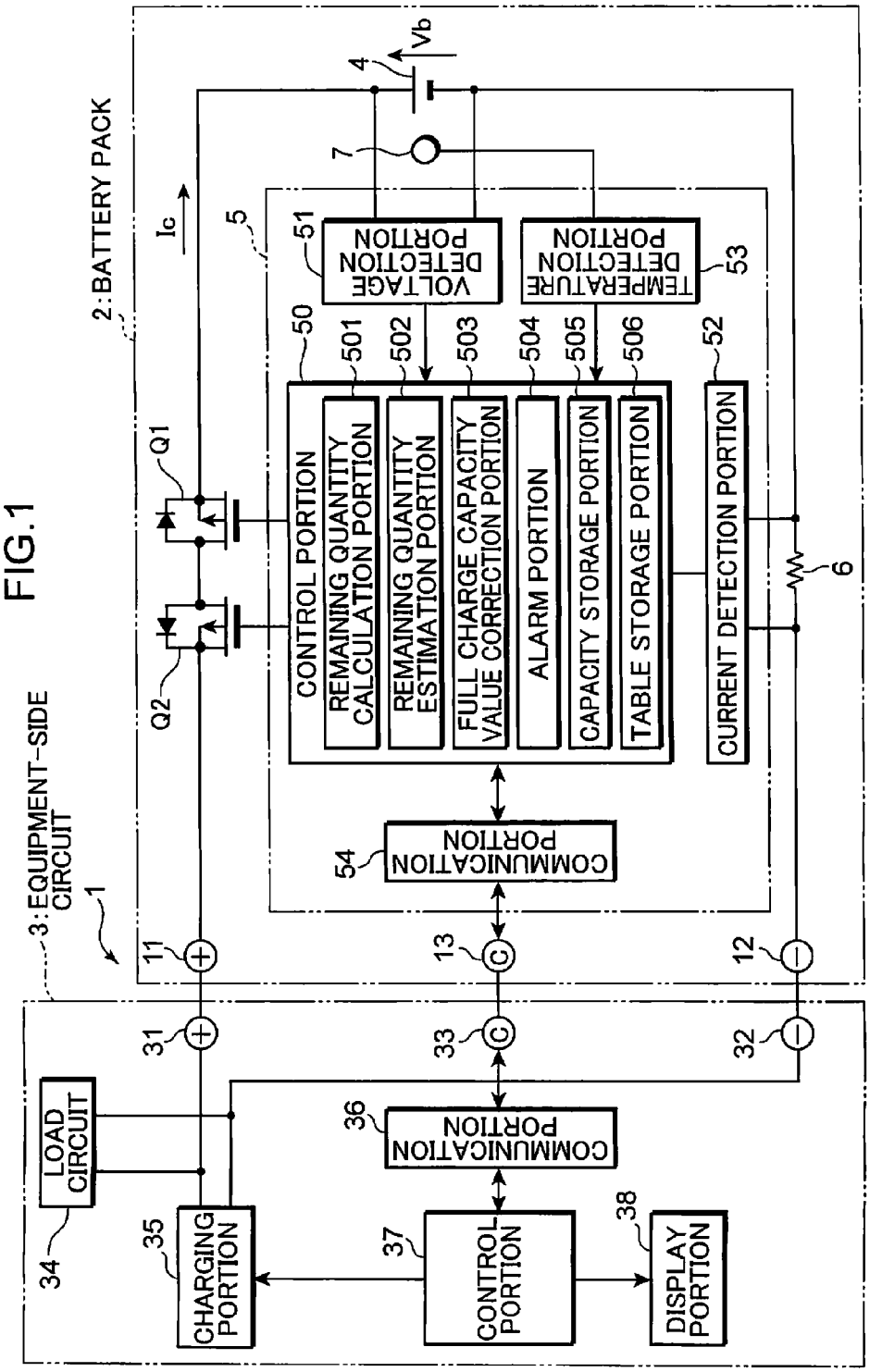

FIG.2A

SOC=95%

| CURRENT Ic \ TEMPERATURE t | 0°C | 20°C | 35°C | 50°C |
|---|---|---|---|---|
| 2A | V11a | V12a | V13a | V14a |
| 1A | V21a | V22a | V23a | V24a |
| 0A | V31a | V32a | V33a | V34a |
| −1A | V41a | V42a | V43a | V44a |
| −2A | V51a | V52a | V53a | V54a |

FIG.2B

SOC=50%

| CURRENT Ic \ TEMPERATURE t | 0°C | 20°C | 35°C | 50°C |
|---|---|---|---|---|
| 2A | V11b | V12b | V13b | V14b |
| 1A | V21b | V22b | V23b | V24b |
| 0A | V31b | V32b | V33b | V34b |
| −1A | V41b | V42b | V43b | V44b |
| −2A | V51b | V52b | V53b | V54b |

FIG.2C

SOC=5%

| CURRENT Ic \ TEMPERATURE t | 0°C | 20°C | 35°C | 50°C |
|---|---|---|---|---|
| 2A | V11c | V12c | V13c | V14c |
| 1A | V21c | V22c | V23c | V24c |
| 0A | V31c | V32c | V33c | V34c |
| −1A | V41c | V42c | V43c | V44c |
| −2A | V51c | V52c | V53c | V54c |

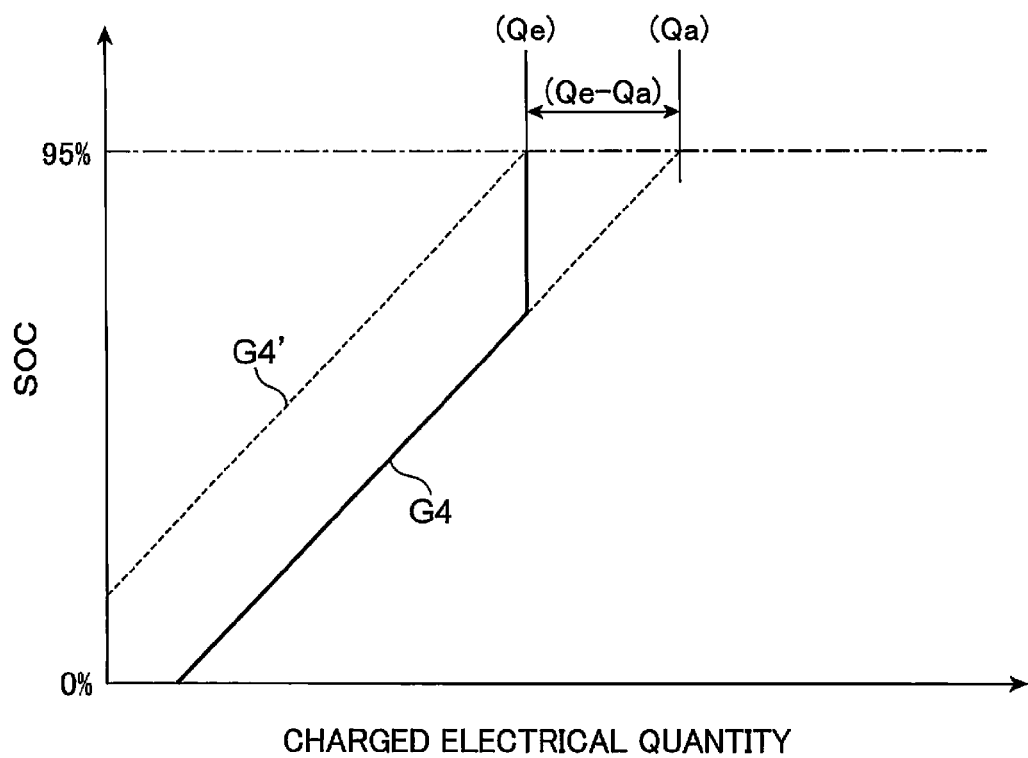

FULL CHARGE CAPACITY VALUE CORRECTION CIRCUIT, BATTERY PACK, AND CHARGING SYSTEM

RELATED APPLICATIONS

This application is the U.S. National Phase under 35 U.S.C. §371 of International Application No. PCT/JP2011/001160, filed on Feb. 28, 2011, which in turn claims the benefit of Japanese Application No. 2010-049531, filed on Mar. 5, 2010, the disclosures of which Applications are incorporated by reference herein.

TECHNICAL FIELD

This invention relates to a full charge capacity value correction circuit which corrects the full charge capacity value of a secondary battery, and to a battery pack and charging system using this circuit.

BACKGROUND ART

Conventionally, secondary batteries have been widely used, in portable personal computers, digital cameras, camcorders, portable telephones and other electronic equipment, in electric cars, hybrid cars and other vehicles, in hybrid elevators, in power systems which combine solar cells and power generation devices with secondary batteries, in uninterruptible power supplies and other battery-mounted devices and systems, and in various other systems and devices.

And, in order to enhance convenience of use of electronic equipment such as for example portable personal computers, the remaining charge in secondary batteries available for use is displayed, or an alarm is sounded before the battery is exhausted, and similar.

In systems and devices such as solar cell power generation systems, hybrid cars and other systems and devices, from the standpoint of stable supply of power to a load, it has been necessary to ensure a state in which a secondary battery is continuously being charged to a certain extent. On the other hand, due to the need to absorb excess generated power and regenerated power, charging is controlled such that the SOC (State of Charge), which is the percentage of charged electrical quantity relative to the full charge capacity (FCC), remains in the range of, for example, 20% to 80%.

In order to detect the remaining charge quantity of a secondary battery available for use (remaining battery quantity) and calculate the SOC, the full charge capacity of the secondary battery must be known. However, the full charge capacity of a secondary battery decreases with degradation of the secondary battery, and if the full charge capacity value at the time of shipment is used without modification to determine the remaining battery quantity and SOC, the error in calculating the remaining battery quantity and SOC increases.

Methods are known in which, after a secondary battery has been shipped and usage of the secondary battery has begun, the secondary battery is completely discharged from the full-charged state, and by integrating the discharge current at this time, the full charge capacity is calculated, and the full charge capacity value is corrected or updated. However, in such methods, in order to correct or otherwise processing the full charge capacity value, it is necessary that the secondary battery in a usage state in the device or system be completely discharged from the fully charged state, and so opportunities to perform correction or updating of the full charge capacity are limited.

Methods are known (see for example Patent Document 1) in which, even when a secondary battery is not completely discharged, the charging current from the beginning of charging until the secondary battery is fully charged is integrated, and the integrated value is added to the charged electrical quantity at the time charging was begun, to calculate the full charge capacity value. By this means, even when the secondary battery is not completely discharged, the full charge capacity value can be corrected.

However, in the method described in Patent Document 1, if the secondary battery is not fully charged, the full charge capacity value cannot be corrected. Hence there is the drawback that, in cases where a user stops charging before full charging occurs, or controls charging such that the secondary battery is not fully charged as in the above-described systems and devices, the full charge capacity value cannot be corrected.

Patent Document 1: Japanese Patent Application Laid-open No. 2006-177764

SUMMARY OF THE INVENTION

An object of this invention is to provide a full charge capacity value correction circuit, battery pack, and charging system, which can correct a full charge capacity value even when the secondary battery is not fully charged, and moreover is not completely discharged.

The full charge capacity value correction circuit according to one aspect of this invention has: a current detection portion which detects a current value of current flowing in a secondary battery; a voltage detection portion which detects a terminal voltage value of the secondary battery; a capacity storage portion which stores a full charge capacity value indicating a full charge capacity of the secondary battery; a remaining quantity calculation portion which calculates, as a accumulated remaining quantity, a remaining charging quantity in the secondary battery from a total value obtained by cumulatively adding charged electrical quantities and subtracting discharged electrical quantities in the secondary battery, based on charge/discharge currents of the secondary battery detected by the current detection portion;

a remaining quantity estimation portion which estimates, as an estimated remaining quantity, a remaining quantity of the secondary battery by using a terminal voltage value detected by the voltage detection portion; and a full charge capacity value correction portion which performs correction, when an estimated remaining quantity estimated by the remaining quantity estimation portion becomes equal to a reference value set in advance, in a case where the estimated remaining quantity is greater than the accumulated remaining quantity, by adding a difference electrical quantity, which is equivalent to a difference between the thus estimated remaining quantity and accumulated remaining quantity calculated by the remaining quantity calculation portion, to the full charge capacity value stored in the capacity storage portion, but in a case where the estimated remaining quantity is less than the accumulated remaining quantity, by subtracting the difference electrical quantity from the full charge capacity value stored in the capacity storage portion.

Further, the battery pack according to one aspect of the invention comprises the above-described full charge capacity value correction circuit, and the secondary battery.

Further, the charging system according to one aspect of the invention comprises the above-described full charge capacity value correction circuit, the secondary battery, and a charging portion which charges the secondary battery.

BRIEF DESCRIPTION OF THE DRAWINGS

FIG. 1 is a block diagram showing an example of a battery pack and charging system comprising the full charge capacity value correction circuit of one embodiment of the invention.

FIG. 2 is an explanatory diagram showing examples of lookup tables stored in the table storage portion shown in FIG. 1.

FIG. 7 is an explanatory diagram conceptually showing operation of the full charge capacity value correction circuit in a process in which the secondary battery is charging.

DESCRIPTION OF EMBODIMENTS

Figure 3:
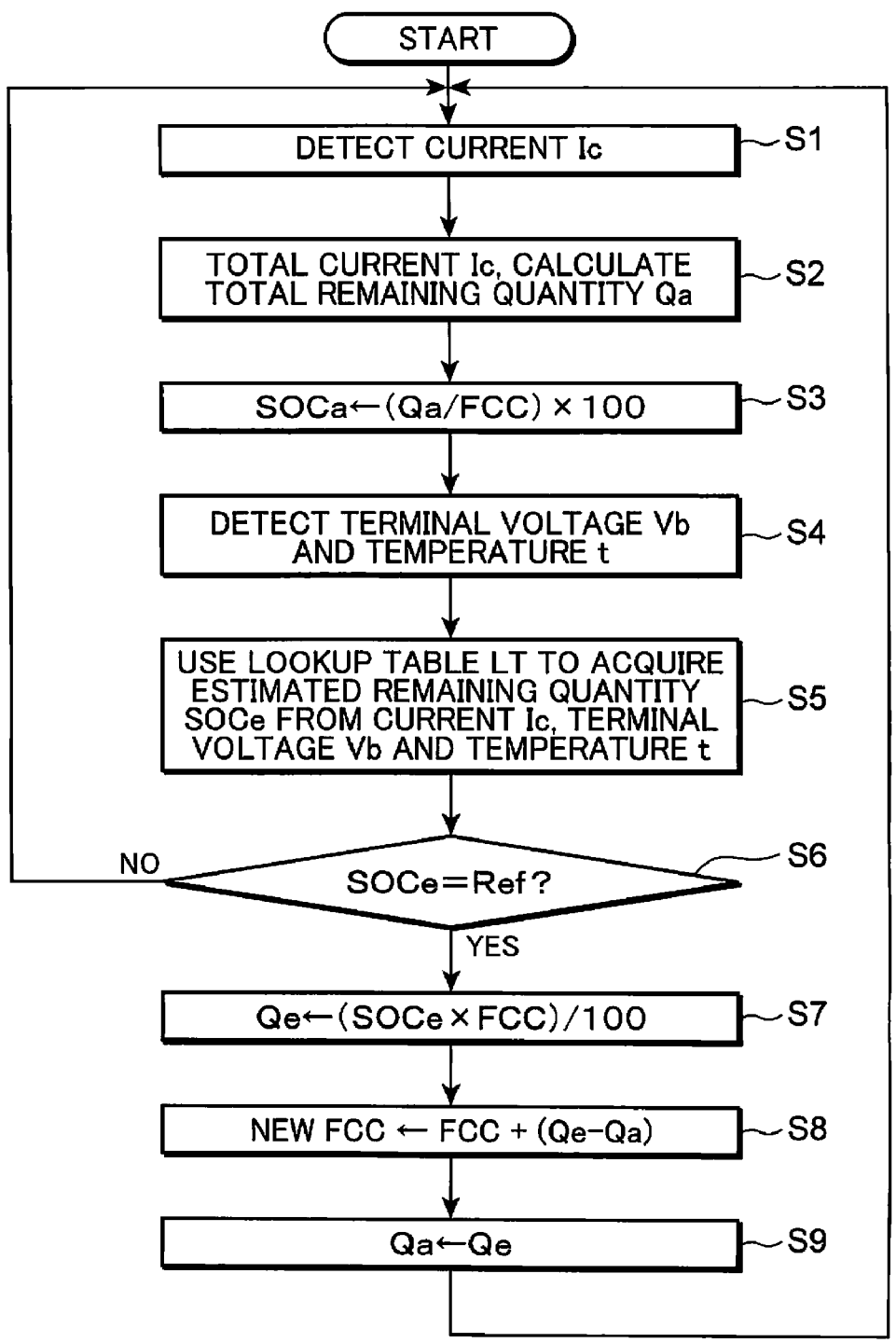
FIG. 3 is a flowchart showing an example of operation of the full charge capacity value correction circuit shown in FIG. 1.

Below, an embodiment of the invention is explained based on the drawings. In the drawings, assignment of the same symbols to members indicates that the members are the same, and explanations are omitted. FIG. 1 is a block diagram showing an example of the configuration of a battery pack 2 and charging system 1, comprising the full charge capacity value correction circuit 5 of one embodiment of the invention. The charging system 1 shown in FIG. 1 is configured combining the battery pack 2 and equipment-side circuit 3.

The charging system 1 is a battery-mounted equipment system such as for example a portable personal computer or digital camera, portable telephone or other electronic equipment, electric car, hybrid car or other vehicle, or similar. The equipment-side circuit 3 is for example the main portion of these battery-mounted equipment systems, and the load circuit 34 is a load circuit which operates through the supply of power from the battery pack 2 in these battery-mounted equipment systems.

The battery pack 2 comprises a secondary battery 4, full charge capacity value correction circuit 5, current detection resistor 6, temperature sensor 7, switching elements Q1 and Q2, and connection terminals 11, 12, 13. The full charge capacity value correction circuit 5 comprises a control portion 50, voltage detection portion 51, current detection portion 52, temperature detection portion 53, and communication portion 54.

The charging system 1 need not necessarily be configured so as to enable separation into the battery pack 2 and equipment-side circuit 3, and a single full charge capacity value correction circuit 5 may be configured for the entire charging system 1. Further, the full charge capacity value correction circuit 5 may be shared between the battery pack 2 and equipment-side circuit 3. Further, the secondary battery 4 need not be made a battery pack, and for example the full charge capacity value correction circuit 5 may be configured as an ECU (Electric Control Unit) for a vehicle.

The equipment-side circuit 3 comprises connection terminals 31, 32, 33, a load circuit 34, a charging portion 35, a communication portion 36, a control portion 37, and a display portion 38. The charging portion 35 is connected to the connection terminals for power supply 31 and 32, and the communication portion 36 is connected to the connection terminal 33.

The battery pack 2 is mounted on the equipment-side circuit 3, and the connection terminals 11, 12, 13 of the battery pack 2 are respectively connected to the connection terminals 31, 32, 33 of the equipment-side circuit 3.

The communication portions 54 and 36 are communication interface circuits configured so as to enable mutual data transmission and reception via the connection terminals 13 and 33.

The charging portion 35 is a power supply circuit which supplies a current and voltage, according to control signals from the control portion 37, to the battery pack 2 via the connection terminals 31 and 32. The charging portion 35 may be a power supply circuit which generates the charging current of the battery pack 2 from for example a commercial power supply voltage, or may be a power generation device which generates power based on natural energy such as for example sunlight, wind power, or hydraulic power, or a power generation device which generates power from the force of internal combustion or similar.

The display portion 38 uses for example a liquid crystal display, or LEDs (Light Emitting Diodes). When for example the equipment-side circuit 3 is a portable personal computer, digital camera, or other electronic equipment, a liquid crystal display or other display device comprised by the electronic equipment may be used as the display portion 38.

The control portion 37 is for example a control circuit configured using a microcomputer. When a request instruction transmitted by the control portion 54 from the control portion 50 in the battery pack 2 is received by the communication portion 36, the control portion 37 controls the charging portion 35 according to the request instruction received by the communication portion 36, and by this means a current and voltage according to the request instruction transmitted from the battery pack 2 are output from the charging portion 35 to the connection terminals 11 and 12.

In the battery pack 2, the connection terminal 11 is connected to the positive electrode of the secondary battery 4 via the switching element Q2 and switching element Q1. As the switching element Q1 and switching element Q2, for example p channel FETs (Field Effect Transistors) are used.

The switching element Q1 has the cathode of the parasitic diode in the direction of the secondary battery 4, and is configured such that upon turning off, only the current in the discharging direction of the secondary battery 4 is shut off. Further, the switching element Q2 has the cathode of the parasitic diode in the direction of the connection terminal 11, and is configured such that upon turning off, only the direction in the charging direction of the secondary battery 4 is shut off. The switching elements Q1 and Q2 are normally turned on, and when abnormally turned off, protect the secondary battery.

Further, the connection terminal 12 is connected to the negative electrode of the secondary battery 4 via the current detection resistor 6, and a current path is formed from the connection terminal 11, via the switching element Q2, switching element Q1, secondary battery 4, and current detection resistor 6, to the connection terminal 12.

The connection terminals 11, 12, 13, 31, 32, 33 need only be electrically connected to the battery pack 2 and equipment-side circuit 3; for example, electrodes and connectors, terminal blocks, and similar may be used, and lands, pads, or another wiring pattern may be used.

The current detection resistor 6 is a so-called shunt resistor used for current detection, which converts the charging current and discharge current of the secondary battery 4 into voltage values. In place of the current detection resistor 6, for example a current transformer, Hall element, or other current detection element may be used.

The temperature sensor 7 is configured using for example a thermistor, thermocouple, or other temperature-sensing element, and is for example firmly attached to the secondary battery 4, or is disposed in proximity to the secondary battery 4. The temperature sensor 7 outputs to the temperature detection portion 53 a voltage signal which indicates the temperature t of the secondary battery 4.

The secondary battery 4 may for example be a single battery, or may for example be an assembled battery in which a plurality of secondary batteries are connected in series, or may for example be an assembled battery in which a plurality of secondary batteries are connected in parallel, or maybe an assembled battery in which series connections and parallel connections are combined. A lithium ion secondary battery is used as the secondary battery 4. The secondary battery 4 is not limited to a lithium ion secondary battery, and for example a nickel-metal hydride secondary battery, nickel cadmium secondary battery, or various other secondary batteries can be used.

However, the remaining quantity estimation portion 502, described below, estimates the remaining quantity (estimated remaining quantity Qe, estimated remaining quantity SOCe) of the secondary battery 4 based on the terminal voltage value Vb of the secondary battery 4, and so a lithium ion secondary battery, which exhibits the greater change in terminal voltage in accordance with change in the remaining quantity of the secondary battery 4 than nickel-metal hydride secondary batteries and nickel cadmium secondary batteries, is more suitable as the secondary battery 4.

The voltage detection portion 51 is configured using for example an analog/digital converter, and detects the terminal voltage (voltage across the terminals) of the secondary battery 4, and outputs a signal indicating this terminal voltage value Vb to the control portion 50.

The current detection portion 52 is configured using for example an analog/digital converter, and detects the voltage Vr across the ends of the current detection resistor 6, and outputs a signal indicating this voltage Vr to the control portion 50 as information indicating the current Ic flowing in the secondary battery 4. Further, the current detection portion 52 displays information indicating the current value Ic (the voltage Vr) as for example a positive value for the direction in which the secondary battery 4 is charged, and as a negative value for the direction in which the secondary battery 4 is discharged.

In the control portion 50, by dividing this voltage Vr by the resistance value R of the current detection resistor 6, the value Ic of the current flowing in the secondary battery 4 is acquired.

The temperature detection portion 53 is configured using for example an analog/digital converter, and converts a voltage value output from the temperature sensor 7 into a digital value, and outputs this as a signal indicating the temperature t to the control portion 50.

The control portion 50 is configured comprising for example a CPU (Central Processing Unit) which executes prescribed computation processing, ROM (Read-Only Memory) which stores a prescribed control program, RAM (Random Access Memory) which temporarily stores data, a capacity storage portion 505 and table storage portion 506 which are for example configured using ROM, and peripheral circuitry for these and similar.

By executing the control program stored in ROM, the control portion 50 functions as the remaining quantity calculation portion 501, remaining quantity estimation portion 502, full charge capacity value correction portion 503, and as an alarm portion 504.

A full charge capacity value FCC is stored in advance as an initial value in the capacity storage portion 505, for example at the time of shipment of the battery pack 2. The initial value of the full charge capacity value FCC is stored in advance as for example a value obtained by theoretical calculation or actual measurement. Further, the full charge capacity value FCC stored in the capacity storage portion 505 can be corrected as appropriate by the full charge capacity value correction portion 503.

The table storage portion 506 stores in advance a lookup table LT which associates remaining quantity settings, set in advance as values representing the remaining quantity of charging of the secondary battery 4, values Ic of the current flowing in the secondary battery 4, and the temperature t of the secondary battery, with the terminal voltage value Vb of the secondary battery 4.

FIG. 2 is an explanatory diagram showing examples of the lookup table LT stored in the table storage portion 506 shown in FIG. 1. FIG. 2A shows the correspondence relation between the terminal voltage value Vb (V11a to V54a), current value Ic of the secondary battery 4, and temperature t of the secondary battery 4, when the SOC (remaining quantity setting) is 95%. Positive values of the current Ic represent the charging direction, and negative values represent the discharging direction. FIG. 2B shows the correspondence relation between the terminal voltage value Vb (V11b to V54b), current value Ic of the secondary battery 4, and temperature t of the secondary battery 4, when the SOC (remaining quantity setting) is 50%. FIG. 2C shows the correspondence relation between the terminal voltage value Vb (V11c to V54c), current value Ic of the secondary battery 4, and temperature t of the secondary battery 4, when the SOC (remaining quantity setting) is 5%.

The lookup tables LT shown in FIG. 2 comprise data, stored in advance in ROM, obtained for example by experimental measurements using the new secondary battery 4. In FIG. 2, examples of lookup tables LT corresponding to an SOC of 95%, 50%, and 5% are shown; but the table storage portion 506 stores lookup tables LT corresponding to the entire range of SOC values from 0% to 100%.

Here, the greater the remaining quantity of the secondary battery 4, that is, the higher the SOC, the higher is the terminal voltage value Vb, so that under conditions in which the current value Ic and temperature t do not change, in FIG. 2A, FIG. 2B and FIG. 2C the relation Va>Vb>V**c (where "*" is a single arbitrary character) obtains.

Further, when current flows in the secondary battery 4, because of the voltage appearing due to the internal resistance of the secondary battery 4, the larger the current value Ic, the higher is the terminal voltage value Vb. That is, during charging the charging current increases, and the larger the current value Ic, the higher is the terminal voltage value Vb. On the other hand, during discharge the current in the discharge direction decreases and the absolute value of the current value Ic, which is negative, decreases; that is, the larger the current value Ic, the higher is the terminal voltage value Vb (the decrease in the terminal voltage value Vb is smaller). Hence in FIG. 2A, FIG. 2B and FIG. 2C, under conditions in which the SOC and temperature t do not change, the relation V1>V2>V3>V4>V5** (where "*" is a single arbitrary character) obtains.

Further, the correspondence relation between the remaining quantity (SOC) and terminal voltage value Vb of the secondary battery 4 changes with the temperature t. In general, the higher the temperature t, the lower is the terminal voltage value Vb corresponding to the same remaining quantity (SOC). Hence in FIG. 2A, FIG. 2B and FIG. 2C, under conditions in which the SOC and current value Ic do not change, the relation V*1*>V*2*>V*3*>V*4*>V*5* (where "*" is a single arbitrary character) obtains.

Depending on the materials constituting the positive and negative electrodes of the battery, there are also cases in which, as the temperature t rises, the terminal voltage value Vb corresponding to the same remaining quantity (SOC) rises. Hence the relation between V*1*, V*2*, V*3*, V*4* and V*5* in FIG. 2A, FIG. 2B and FIG. 2C may be set appropriately according to the characteristics of the secondary battery 4.

The lookup tables LT shown in FIG. 2 associate the SOC (remaining quantity setting), terminal voltage value Vb, current Ic flowing in the secondary battery 4, and temperature t of the secondary battery 4; but the lookup tables LT need not include the temperature t of the secondary battery 4 as a parameter. Further, the lookup tables LT need not include the temperature t and current value Ic as parameters.

The remaining quantity calculation portion 501 calculates the remaining quantity charging the secondary battery 4, as the accumulated remaining quantity Qa, by accumulating the current values Ic detected by the current detection portion 52 for each unit time. In this case, the current value Ic is represented by a positive value for the direction of current charging of the secondary battery 4 and by a negative value for the direction of current discharging the secondary battery 4, so that the remaining quantity calculation portion 501 adds charged electrical quantities charging the secondary battery 4, and subtracts discharging electrical quantities discharging the secondary battery 4, to calculate the accumulated remaining quantity Qa charging the secondary battery 4.

Further, the remaining quantity calculation portion 501 calculates the ratio (percentage) of the accumulated remaining quantity Qa relative to the full charge capacity value FCC stored in the capacity storage portion 505, as the accumulated remaining quantity SOCa which is the SOC (State of Charge) equivalent to the remaining quantity. By this means, the remaining quantity calculation portion 501 represents the accumulated remaining quantity in terms of SOC.

The accumulated remaining quantity SOCa is given by equation (1) below. The remaining quantity calculation portion 501 may use the accumulated remaining quantity Qa without modification as the battery remaining quantity.

$$SOCa=(Qa/FCC)\times 100(\%) \quad (1)$$

The remaining quantity estimation portion 502 uses the terminal voltage value Vb detected by the voltage detection portion 51, the current value Ic detected by the current detection portion 52, and the temperature t detected by the temperature detection portion 53, to estimate the remaining quantity of the secondary battery 4 as the estimated remaining quantity SOCe. And, the remaining quantity estimation portion 502 may convert the estimated remaining quantity SOCe into an electrical quantity, to use the estimated remaining quantity Qe as the estimated remaining quantity.

The reference value Ref is a value set in advance to indicate that the SOC of the secondary battery 4 is near zero, and may for example be set to 5%. In a case where the remaining quantity estimation portion 502 uses the estimated remaining quantity Qe as the estimated remaining quantity of the battery, the reference value Ref may for example be an electrical quantity equivalent to an SOC of 5%.

Specifically, when the combination of the terminal voltage value Vb, current value Ic and temperature t effectively coincides with a combination of associated terminal voltage value Vb, current value Ic and temperature t in the lookup table LT, the remaining quantity estimation portion 502 estimates the SOC (remaining quantity setting) associated with the terminal voltage value Vb, current value Ic and temperature t by the lookup table LT as the estimated remaining quantity SOCe representing by the SOC the electrical quantity charging the secondary battery 4.

Here, in the lookup table LT the terminal voltage value Vb and SOC are associated such that the more the terminal voltage value Vb rises, the more the SOC of the secondary battery 4 increases, so that the greater the increase in terminal voltage value Vb, the more the remaining quantity estimation portion 502 increases the estimated remaining quantity SOCe.

In a lookup table LT, current values Ic and terminal voltage values Vb are associated such that for the same SOC, as the current value Ic rises, that is, as the current Ic in the charging direction increases, the terminal voltage value Vb rises. Further, in a lookup table LT, current values Ic and terminal voltage values Vb are associated such that for the same SOC, as the discharge current declines, that is, as the absolute value of the current Ic in the discharging direction decreases, the terminal voltage value Vb rises. Hence upon comparing the current Ic detected by the current detection portion 52 and the terminal voltage Vb detected by the voltage detection portion 51 with the lookup table LT, the remaining quantity estimation portion 502 estimates the estimated remaining quantity SOCe such that the more the current Ic increases the more the estimated remaining quantity SOCe decreases, that is, as the charging current increases and the discharging current decreases, the estimated remaining quantity SOCe is decreased.

Further, in a lookup table LT, temperature values t and terminal voltage values Vb are associated such that, for the same SOC, the higher the temperature t, the more the terminal voltage Vb falls, so that upon comparing a temperature t detected by the temperature detection portion 53 and a terminal voltage Vb detected by the voltage detection portion 51 with the lookup table LT, the remaining quantity estimation portion 502 estimates the estimated remaining quantity SOCe such that the higher the temperature t, the more the estimated remaining quantity SOCe is increased.

In this way, a lookup table LT associates the SOC (remaining quantity) of the secondary battery 4 with a plurality of parameters correlated with the SOC of the secondary battery 4, which are the terminal voltage Vb, current Ic, and temperature t; hence as a result of reducing the effects of the current Ic and temperature t on the estimated remaining quantity SOC, the remaining quantity estimation portion 502 can precisely estimate the estimated remaining quantity SOCe.

And, the remaining quantity estimation portion 502 calculates the estimated remaining quantity Qe, representing the estimated remaining quantity as an electrical quantity by equation (2) below.

$$Qe=(SOCe\times FCC)/100 \quad (2)$$

The lookup table LT may represent remaining quantity settings as electrical quantities, and in this case the remaining quantity estimation portion 502 may directly express electrical quantity settings obtained from the lookup table LT as estimated remaining quantities Qe.

Whereas values set in the lookup table LT are discrete values, the terminal voltage values Vb detected by the voltage detection portion 51, current values Ic detected by the current detection portion 52, and temperatures t detected by the temperature detection portion 53 change continuously. Hence after for example performing rounding to remove fractions or other approximation processing of the voltage value Vb detected by the voltage detection portion 51, current value Ic detected by the current detection portion 52, and temperature t detected by the temperature detection portion 53, the remaining quantity estimation portion 502 compares the values with the lookup table LT. "Effectively coincides" means that cases are included in which, when in this way the voltage value Vb detected by the voltage detection portion 51, current value Ic detected by the current detection portion 52, and temperature t detected by the temperature detection portion 53 are for example rounded to remove fractions or subjected to other approximation processing, there is coincidence.

The remaining quantity estimation portion 502 is not limited to an example in which the terminal voltage value Vb, current value Ic and temperature t are used to estimate the remaining quantity of the secondary battery 4; the terminal voltage value Vb alone may be used in estimation, or the terminal voltage value Vb and current value Ic may be used in estimation, or the terminal voltage value Vb and temperature t may be used to estimate the remaining quantity of the secondary battery 4.

When the estimated remaining quantity SOCe estimated by the remaining quantity estimation portion 502 becomes the reference value Ref, the full charge capacity value correction portion 503 adds, to the full charge capacity value FCC stored in the capacity storage portion 505, a difference electrical quantity Qd=Qe−Qa, equivalent to the difference between the estimated remaining quantity Qe thus estimated and the accumulated remaining quantity Qa calculated by the remaining quantity calculation portion 501. That is, when the estimated remaining quantity Qe is greater than the accumulated remaining quantity Qa, the absolute value of (Qe−Qa) is added to the full charge capacity value FCC stored in the capacity storage portion 505, and when the estimated remaining quantity Qe is smaller than the accumulated remaining quantity Qa, the absolute value of (Qe−Qa) is subtracted from the full charge capacity value FCC stored in the capacity storage portion 505; by this means, the full charge capacity value FCC is corrected.

Specifically, the full charge capacity value correction portion 503 uses the following equation (3) to correct the full charge capacity value FCC.

$$\text{New FCC} \leftarrow \text{current FCC} + (Qe - Qa) \quad (3)$$

When the estimated remaining quantity SOCe estimated by the remaining quantity estimation portion 502 becomes equal to or less than the reference value Ref, the alarm portion 504 causes the communication portion 54 to transmit to the control portion 37, via the communication portion 36, a signal indicating that the remaining quantity of the secondary battery 4 is close to zero. Then, the control portion 37 causes the display portion 38 to display a message indicating that the remaining quantity of the secondary battery 4 is close to zero, and a message urging the user to charge the secondary battery 4, and similar.

Next, operation of the full charge capacity value correction circuit 5 shown in FIG. 1 is explained. FIG. 3 is a flowchart showing one example of operation of the full charge capacity value correction circuit 5 shown in FIG. 1.

First, the current Ic flowing in the secondary battery 4 is detected by the current detection portion 52 (step S1). Next, the current value Ic is totaled in each unit time by the remaining quantity calculation portion 501 to calculate the accumulated remaining quantity Qa charging the secondary battery 4 (step S2). Next, equation (1) is used by the remaining quantity calculation portion 501 to calculate the accumulated remaining quantity SOCa from the full charge capacity value FCC stored in the capacity storage portion 505 and the accumulated remaining quantity Qa (step S3).

Next, the terminal voltage Vb is detected by the voltage detection portion 51, and the temperature t of the secondary battery 4 is detected by the temperature detection portion 53 (step S4). And, the lookup table LT stored in the table storage portion 506 is referenced by the remaining quantity estimation portion 502. Then, the estimated remaining quantity SOCe is acquired as the SOC associated with the current value Ic, terminal voltage value Vb, and temperature t in the lookup table LT (step S5).

And, the estimated remaining quantity SOCe and the reference value Ref are compared by the full charge capacity value correction portion 503 (step S6), and if the estimated remaining quantity SOCe and the reference value Ref are not equal (NO in step S6), steps S1 to S6 are repeated, but if the estimated remaining quantity SOCe and the reference value Ref are equal (YES in step S6), processing proceeds to step S7 to correct the full charge capacity value FCC.

And, in step S7 equation (2) is used by the remaining quantity estimation portion 502 to calculate the estimated remaining quantity Qe from the full charge capacity value FCC stored in the capacity storage portion 505 and the estimated remaining quantity SOCe (step S7).

From the full charge capacity value FCC stored in the capacity storage portion 505, the estimated remaining quantity Qe estimated by the remaining quantity estimation portion 502, and the accumulated remaining quantity Qa calculated by the remaining quantity calculation portion 501, the full charge capacity value correction portion 503 uses equation (3) to calculate the new full charge capacity value FCC, causes this new full charge capacity value FCC to be stored in the capacity storage portion 505, and corrects the full charge capacity value FCC (step S8).

Further, the estimated remaining quantity Qe is used to update the accumulated remaining quantity Qa as the new accumulated remaining quantity Qa (step S9), and steps S1 to S9 are again repeated.

In the above, through the processing of steps S1 to S9, the full charge capacity value FCC is corrected with the timing at which the estimated remaining quantity SOCe becomes the reference value Ref, so that the full charge capacity value FCC can be corrected without causing full charging of the secondary battery 4, and moreover without causing complete discharging.

Further, when the estimated remaining quantity SOCe becomes equal to or less than the reference value Ref, the alarm portion 504 causes a message indicating that the remaining quantity of the secondary battery 4 is close to zero, or a message urging charging of the secondary battery 4, or other alarms to be reported to the user, so that there is a strong possibility that the user will use the secondary battery 4 in a manner so as to cause discharge until receiving the report of such an alarm. Then, because there is a strong possibility that the secondary battery 4 will be discharged without being charged until the estimated remaining quantity SOCe becomes equal to or less than the reference value Ref, by correcting the full charge capacity value FCC with the timing at which the estimated remaining quantity SOCe becomes the reference value Ref, it is possible to increase the opportunities for correcting the full charge capacity value FCC.

Further, even when an alarm portion 504 is not comprised, as the reference value Ref a remaining quantity close to zero, such as for example approximately 5%, is set, so that for example in the case of equipment such as portable telephone sets which are frequently used in a mobile mode, users often use up the battery completely, and there is a strong possibility that the secondary battery 4 is discharged without being charged until the estimated remaining quantity SOCe becomes equal to or less than the reference value Ref; by correcting the full charge capacity value FCC with the timing at which the estimated remaining quantity SOCe becomes the reference value Ref, it is possible to increase the opportunities for correcting the full charge capacity value FCC.

Further, as the reference value Ref, a remaining quantity near zero, that is, a remaining quantity close to complete discharge is set, so that the estimated remaining quantity Qe and estimated remaining quantity SOCe are estimated in a state close to complete discharge. Here, the closer the secondary battery is to complete discharge (with SOC at 0%), the higher is the correlation between the SOC and the terminal voltage value Vb, so that the amount of change in the terminal voltage Vb for a change amount of SOC is large. Hence the influence of voltage measurement errors is reduced. Consequently by causing the remaining quantity estimation portion 502 to estimate the estimated remaining quantity Qe and estimated remaining quantity SOCe at a state close to complete discharge, the precision of estimation of the estimated remaining quantity Qe and estimated remaining quantity SOCe can be improved, and as a result the precision of correction of the full charge capacity value FCC by the full charge capacity value correction portion 503 can be improved.

Figure 4:
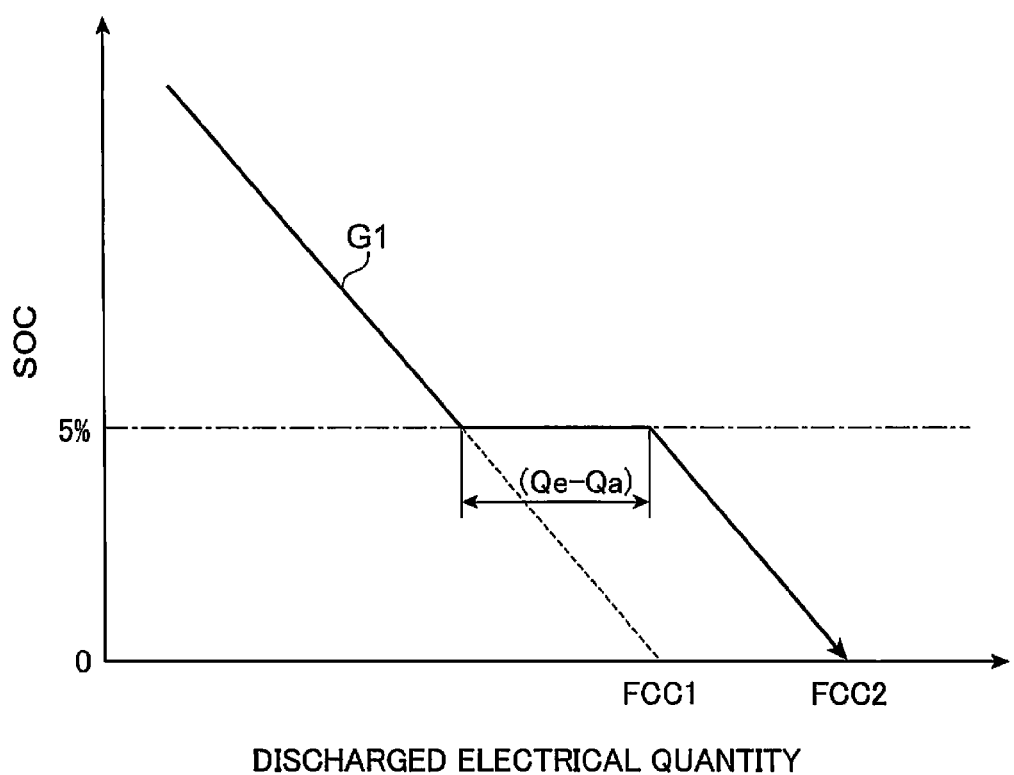
FIG. 4 is an explanatory diagram conceptually showing operation of the full charge capacity value correction circuit in a process in which the secondary battery is discharging.
Figure 5:
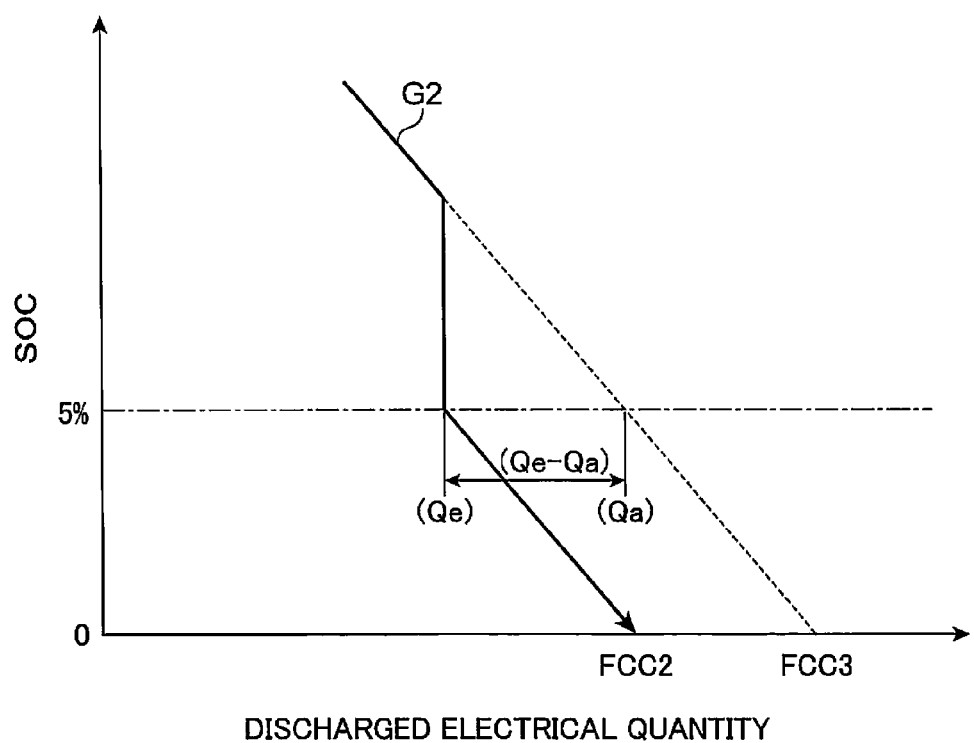
FIG. 5 is an explanatory diagram conceptually showing operation of the full charge capacity value correction circuit in a process in which the secondary battery is discharging.

FIG. 4 and FIG. 5 are explanatory diagrams conceptually showing operation of the full charge capacity value correction circuit 5 in a process in which the secondary battery 4 is discharged. The horizontal axes in FIG. 4 and FIG. 5 indicate the discharged electrical quantity in the case of discharging the secondary battery 4 from the fully charged state, and the vertical axes indicate the SOC (total remaining quantity SOCa) of the secondary battery 4. The graph G1 shows changes in the relation between the SOC and discharged electrical quantity in a case in which discharge of the secondary battery 4 is continued.

As shown in FIG. 4, when the secondary battery 4 is discharged, the SOC falls, and the discharged electrical quantity from the fully-charged state increases. And, when discharge is continued without modification and the estimated remaining quantity SOCe estimated by the remaining quantity estimation portion 502 becomes 5% (the reference value Ref), the estimated remaining quantity Qe is estimated by the remaining quantity estimation portion 502 in step S7. And, the difference electrical quantity (Qe−Qa) is calculated by the full charge capacity value correction portion 503, this difference electrical quantity (Qe−Qa) is added to the full charge capacity value FCC, and the new full charge capacity value FCC is calculated (step S8).

Here, when the estimated remaining quantity Qe is greater than the accumulated remaining quantity Qa, the absolute value of the difference electrical quantity (Qe−Qa) is added to the full charge capacity value FCC, and when the estimated remaining quantity Qe is smaller than the accumulated remaining quantity Qa, the absolute value of the difference electrical quantity (Qe−Qa) is subtracted from the full charge capacity value FCC.

FIG. 4 shows the case in which the estimated remaining quantity Qe is greater than the accumulated remaining quantity Qa, and FIG. 5 shows the case in which the estimated remaining quantity Qe is smaller than the accumulated remaining quantity Qa.

Operation in this step S8 is explained conceptually using FIG. 4. The full charge capacity value FCC prior to correction is equivalent to the discharge capacity FCC1 at the point at which the extension of graph G1 (broken line) intersects a SOC of 0%. On the other hand, processing to add the difference electrical quantity (Qe−Qa) when the SOC is 5% is equivalent to shifting the graph G1 in the direction of increase of the discharge electrical quantity by the amount of the difference electrical quantity (Qe−Qa), and the discharge capacity FCC2 of the point at which this shifted graph intersects the SOC of 0% is equivalent to the full charge capacity value FCC after correction.

On the other hand, when the estimated remaining quantity Qe is smaller than the accumulated remaining quantity Qa, as shown in FIG. 5, the full charge capacity value FCC prior to correction is equivalent to the discharge capacity FCC3 at the point at which the extension of graph G2 (broken line) intersects a SOC of 0%. On the other hand, in step S8, the processing to add the difference electrical quantity (Qe−Qa) when the SOC is 5% is equivalent to shifting the graph G2 in the direction of decrease of the discharge electrical quantity by the amount of the difference electrical quantity (Qe−Qa), and the discharge capacity FCC2 of the point at which this shifted graph intersects the SOC of 0% is equivalent to the full charge capacity value FCC after correction.

The alarm portion 504 need not necessarily be comprised. Further, the reference value Ref is not limited to a setting close to a remaining quantity of zero. For example, in cases where control is executed so as to maintain the SOC within a constant range, as for example in solar cell power generation, hybrid cars and other systems, the reference value Ref may be set near the center of the range. For example, in a case in which the SOC is controlled within the range 20% to 80%, if the reference value Ref is made 50%, the precision of correction of the full charge capacity value FCC can be increased, so that there is less concern that, for example the difference between the full charge capacity value FCC and the actual full charge capacity of the secondary battery 4 is increased due to degradation or other factors.

Figure 6:
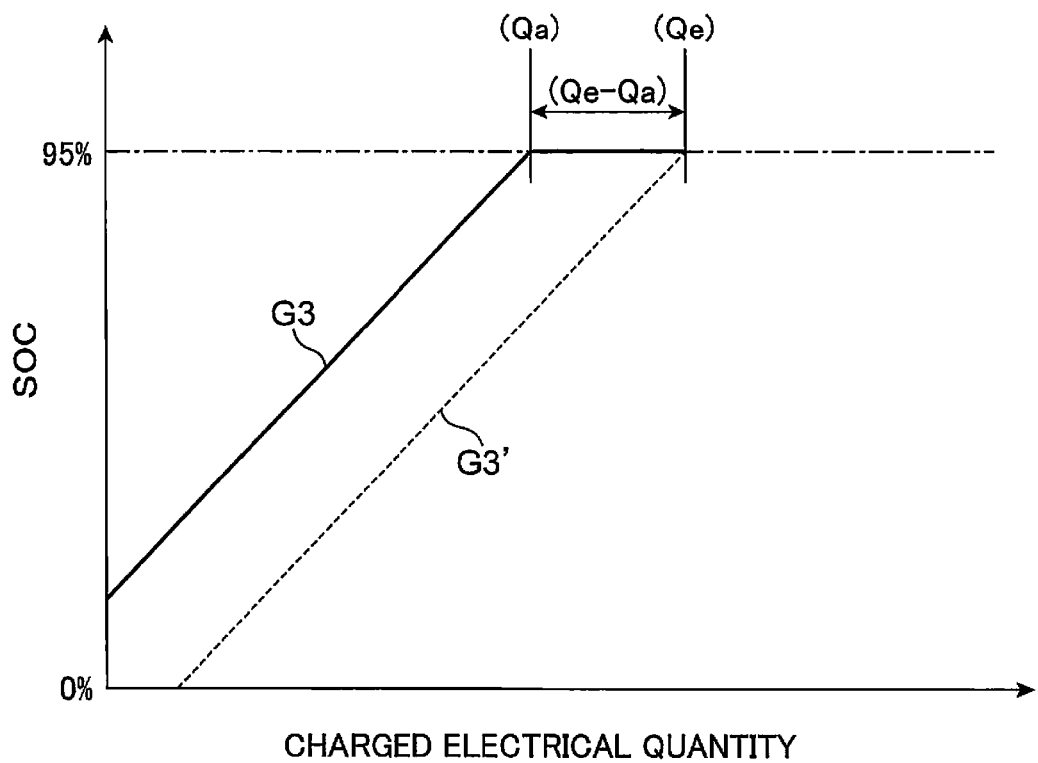
FIG. 6 is an explanatory diagram conceptually showing operation of the full charge capacity value correction circuit in a process in which the secondary battery is charging.

FIG. 6 and FIG. 7 are explanatory diagrams conceptually showing operation of the full charge capacity value correction circuit 5 in a process in which the secondary battery 4 is charged. In FIG. 6 and FIG. 7, examples are shown in which the reference value Ref is set to 95%. The horizontal axes in FIG. 6 and FIG. 7 indicate the charged electrical quantity in the case of charging the secondary battery 4, and the vertical axes indicate the SOC (accumulated remaining quantity SOCa) of the secondary battery 4. The graphs G3 and G4 show changes in the relation between the SOC and charged electrical quantity in a case in which charging of the secondary battery 4 is continued.

As shown in FIG. 6, when the secondary battery 4 is charged, the SOC increases. And, when charging is continued without modification and the estimated remaining quantity SOCe estimated by the remaining quantity estimation portion 502 becomes 95% (the reference value Ref), the estimated remaining quantity Qe is estimated by the remaining quantity estimation portion 502 in step S7. And, the difference electrical quantity (Qe−Qa) is calculated by the full charge capacity value correction portion 503, this difference electrical quantity (Qe−Qa) is added to the full charge capacity value FCC, and the new full charge capacity value FCC is calculated (step S8).

Here, when the estimated remaining quantity Qe is greater than the accumulated remaining quantity Qa, the absolute value of the difference electrical quantity (Qe−Qa) is added to the full charge capacity value FCC, and when the estimated remaining quantity Qe is smaller than the accumulated remaining quantity Qa, the absolute value of the difference electrical quantity (Qe−Qa) is subtracted from the full charge capacity value FCC.

FIG. 6 shows the case in which the estimated remaining quantity Qe is greater than the accumulated remaining quantity Qa, and FIG. 7 shows the case in which the estimated remaining quantity Qe is smaller than the accumulated remaining quantity Qa.

Operation in this step S8 is explained conceptually using FIG. 6. Processing to add to the full charge capacity value FCC the difference electrical quantity (Qe−Qa) when the SOC is 95% is equivalent to shifting the graph G3 in the direction of increase of the charged electrical quantity by the amount of the difference electrical quantity (Qe−Qa). The graph G3' obtained by this shifting indicates the correct SOC based on the full charge capacity value FCC after correction.

On the other hand, the explanation for the case in which the estimated remaining quantity Qe is smaller than the accumulated remaining quantity Qa is based on FIG. 7. When the estimated remaining quantity Qe is smaller than the accumulated remaining quantity Qa, in step S8, processing to add the difference electrical quantity (Qe−Qa) when the SOC is 95% to the full charge capacity value FCC, that is, processing to subtract the absolute value of (Qe−Qa) from the full charge capacity value FCC, is equivalent to shifting the graph G4 in the direction of decreasing charging electrical quantity by the difference electrical quantity (Qe−Qa), and this shifted graph G4' indicates the correct SOC based on the full charge capacity value FCC after correction.

That is, the full charge capacity value correction circuit according to one aspect of the invention comprises a current detection portion which detects a current value of current flowing in a secondary battery; a voltage detection portion which detects a terminal voltage value of the secondary battery; a capacity storage portion which stores a full charge capacity value indicating a full charge capacity of the secondary battery; a remaining quantity calculation portion which calculates, as a accumulated remaining quantity, a remaining charging quantity in the secondary battery from a total value obtained by cumulatively adding charged electrical quantities and subtracting discharged electrical quantities in the secondary battery, based on charge/discharge currents of the secondary battery detected by the current detection portion; a remaining quantity estimation portion which estimates, as an estimated remaining quantity, a remaining quantity of the secondary battery by using a terminal voltage value detected by the voltage detection portion; and a full charge capacity value correction portion which performs correction, when an estimated remaining quantity estimated by the remaining quantity estimation portion becomes equal to a reference value set in advance, in a case where the estimated remaining quantity is greater than the accumulated remaining quantity, by adding a difference electrical quantity, which is equivalent to a difference between the thus estimated remaining quantity and accumulated remaining quantity calculated by the remaining quantity calculation portion, to the full charge capacity value stored in the capacity storage portion, but in a case where the estimated remaining quantity is less than the accumulated remaining quantity, by subtracting the difference electrical quantity from the full charge capacity value stored in the capacity storage portion.

By means of this configuration, based on the charge/discharge current of the secondary battery, the remaining quantity charging the secondary battery is calculated as a accumulated remaining quantity from the total value obtained by cumulative addition of charged electrical quantities and subtraction of discharged electrical quantities in the secondary battery by the remaining quantity calculation portion. And by means of the remaining quantity estimation portion, the terminal voltage value of the secondary battery is used to estimate the remaining quantity of this secondary battery as an estimated remaining quantity. Further, when the estimated remaining quantity estimated by the remaining quantity estimation portion has become the reference value, the full charge capacity value correction portion adds to the full charge capacity value stored in the capacity storage portion a difference electrical quantity, equivalent to the difference between the estimated remaining quantity thus estimated and the accumulated remaining quantity calculated by the remaining quantity calculation portion, when the estimated remaining quantity is greater than the accumulated remaining quantity, and subtracts from the full charge capacity value stored in the capacity storage portion the difference electrical quantity when the estimated remaining quantity is less than the accumulated remaining quantity, to correct the full charge capacity value. In this case, the difference electrical quantity, which is the difference between the total value obtained by cumulatively adding charged electrical quantities and subtracting discharging electrical quantities and the estimated remaining quantity of the secondary battery estimated using the terminal voltage value of the secondary battery, is thought to be equivalent to the amount of change in the full charge capacity value, and thus by using the difference electrical value to correct the full charge capacity value, the full charge capacity value stored in the capacity storage portion can be corrected according to the actual decrease in the full charge capacity accompanying degradation of the secondary battery.

And, the full charge capacity value can be corrected when the remaining quantity has reached the reference value even when the secondary battery is not fully charged or completely discharged, so that correction of the full charge capacity can be performed without fully charging or completely discharging the secondary battery.

Further, it is preferable that the reference value be a remaining quantity in the range of charge states in which the secondary battery is not fully charged, and moreover is not completely discharged.

If the reference value is set to a remaining quantity in the range of charge states in which the secondary battery is not fully charged and moreover is not completely discharged, the reliability with which the full charge capacity is corrected when the secondary battery is not fully charged and not completely discharged is increased.

Further, it is preferable that the remaining quantity estimation portion estimate the estimated remaining quantity such that as a terminal voltage value detected by the voltage detection portion increases, the estimated remaining quantity becomes greater.

The greater the charging remaining quantity, the higher is the terminal voltage of the secondary battery, so that by estimating the estimated remaining quantity such that the higher the terminal voltage value the greater is the estimated remaining quantity, the estimated remaining quantity charging the secondary battery can be estimated.

Further, it is preferable that the remaining quantity estimation portion estimate the estimated remaining quantity by using the terminal voltage detected by the voltage detection portion and the current value detected by the current detection portion.

The terminal voltage of the secondary battery changes with the current flowing in the secondary battery. In addition to the terminal voltage value of the secondary battery, by having the remaining quantity estimation portion use the current detected by the current detection portion to estimate the estimated remaining quantity, the precision of estimation of the estimated remaining quantity is improved, and consequently the precision of correction of the full charge capacity value can be improved.

Further, it is preferable that the remaining quantity estimation portion estimate the estimated remaining quantity such that as the current value in a discharge direction detected by the current detection portion decreases, the estimated remaining quantity becomes smaller.

In the secondary battery, the greater the decrease in discharge current during discharge, the more the voltage drop arising from the internal resistance of the secondary battery decreases, so that the terminal voltage value rises, and thus by estimating the estimated remaining quantity such that the greater the decrease in current in the discharge direction detected by the current detection portion, the greater is the decrease in estimated remaining quantity, the influence of the current flowing in the secondary battery on the terminal voltage is reduced, and the precision of estimation of the estimated remaining quantity can be improved.

Further, it is preferable that a temperature detection portion which detects the temperature of the secondary battery be further provided, and that the remaining quantity estimation portion use the temperature detected by the temperature detection portion to estimate the estimated remaining quantity.

The relation between the terminal voltage of the secondary battery and the remaining quantity changes under the influence of temperature. Hence in addition to the terminal voltage value of the secondary battery, by having the remaining quantity estimation portion use the temperature detected by the temperature detection portion to estimate the estimated remaining quantity, the precision of estimation of the estimated remaining quantity is improved, and as a result the precision of correction of the full charge capacity value can be improved.

Further, it is preferable that a temperature detection portion be further provided, and that the remaining quantity estimation portion use the terminal voltage detected by the voltage detection portion, the current value detected by the current detection portion, and the temperature detected by the temperature detection portion to estimate the estimated remaining quantity.

By means of this configuration, in addition to the terminal voltage value of the secondary battery and the current detected by the current detection portion, by estimating the estimated remaining quantity using the temperature detected by the temperature detection portion, the precision of estimation of the estimated remaining quantity is further improved, and as a result the precision of correction of the full charge capacity value can be further improved.

Further, it is preferable that the remaining quantity estimation portion estimate the estimated remaining quantity such that as the temperature detected by the temperature detection portion increases, the estimated remaining quantity becomes greater.

In general secondary batteries, in which the higher the temperature, the more the terminal voltage value falls, by estimating the estimated remaining quantity such that the higher the temperature detected by the temperature detection portion the greater is the estimated remaining quantity, the influence of the temperature of the secondary battery on the terminal voltage value can be reduced, and the precision of estimation of the estimated remaining quantity can be improved.

Further, it is preferable that a temperature detection portion which detects the temperature of the secondary battery, and a table storage portion which stores a lookup table associating remaining quantity settings that are set in advance as values representing the remaining quantity charging the secondary battery, values of the current flowing in the secondary battery, and temperatures of the secondary battery with values of the terminal voltage of the secondary battery, be further provided, and that the remaining quantity estimation portion estimate, as the estimated remaining quantity, the remaining quantity setting that is associated, by the lookup table stored in the table storage portion, with the terminal voltage detected by the voltage detection portion, the current value detected by the current detection portion, and the temperature detected by the temperature detection portion.

By means of this configuration, a lookup table associates remaining quantities of a secondary battery with terminal voltage values, current values, and temperatures, which are correlated with the remaining quantity, so that the remaining quantity estimation portion can use the terminal voltage detected by the voltage detection portion, current detected by the current detection portion, and temperature detected by the temperature detection portion, to easily estimate the estimated remaining quantity of the secondary battery, while reducing the influence of the current flowing in the secondary battery and the temperature.

Further, it is preferable that in the lookup table, the remaining quantity settings be expressed as a ratio of the charged electrical quantity of the secondary battery to the full charge capacity value of the secondary battery, and that the full charge capacity value correction portion calculate the difference electrical quantity based on the estimated remaining quantity estimated by the remaining quantity estimation portion as the ratio of the charged electrical quantity to the full charge capacity value, the full charge capacity value stored in the capacity storage portion, and the accumulated remaining quantity.

The terminal voltage value of the secondary battery is more strongly correlated with the ratio of the charged electrical quantity to the full charge capacity value of the secondary battery than to the absolute value of the charged electrical quantity charging the secondary battery. Hence in the lookup table, the characteristics of the secondary battery can be more accurately represented by expressing the remaining quantity settings as ratios of the charged electrical quantity of the secondary battery to the full charge capacity value of the secondary battery, than by expressing the remaining quantity settings as absolute values of the charged electrical quantity. Hence using a lookup table which represents remaining quantity settings as ratios of the charged electrical quantity to the full charge capacity value of the secondary battery, the full charge capacity value correction portion can calculate the difference electrical quantity based on the estimated remaining quantity estimated as the ratio of the charged electrical quantity to the full charge capacity value by the remaining quantity estimation portion, the full charge capacity value stored in the capacity storage portion, and the accumulated remaining quantity, and by improving the precision of calculation of the difference electrical quantity, can improve the precision of correction of the full charge capacity value.

Further, it is preferable that the reference value be a value set in advance to indicate that the remaining quantity is close to zero, and that an alarm portion, which issues an alarm when the accumulated remaining quantity calculated by the remaining quantity calculation portion becomes the reference value, be further comprised.

By means of this configuration, when the accumulated remaining quantity calculated by the remaining quantity calculation portion becomes close to zero, an alarm is reported by the alarm portion, and there is a strong possibility that the user will use the secondary battery in a manner in which the secondary battery is discharged until the alarm is reported. Hence because there is a strong possibility that the secondary battery will be discharged, without being charged, until the accumulated remaining quantity becomes equal to or less than the reference value, by correcting the full charge capacity value with the timing at which the accumulated remaining quantity becomes the reference value, it is possible to increase the opportunities for correcting the full charge capacity value FCC.

Further, the battery pack according to one aspect of the invention comprises a full charge capacity value correction circuit described above, and the secondary battery.

By means of this configuration, in the battery pack, the full charge capacity value can be corrected without fully charging the secondary battery, and moreover without completely discharging the secondary battery.

Further, the charging system according to one aspect of the invention comprises a full charge capacity value correction circuit described above, the secondary battery, and a charging portion which charges the secondary battery.

By means of this configuration, in a charging system comprising a secondary battery and a charging portion which charges the secondary battery, the full charge capacity value can be corrected without fully charging the secondary battery, and moreover without completely discharging the secondary battery.

A full charge capacity value correction circuit, battery pack, and charging system configured in this way can correct the full charge capacity value of a secondary battery without fully charging the secondary battery, and moreover without completely discharging the secondary battery.

This application is based on Japanese Patent Application No. 2010-049531, filed on Mar. 5, 2010, the contents of which are incorporated herein by reference.

The specific embodiments or examples provided in detailed descriptions of the invention are merely intended to clarify the technical nature of the invention, and the invention should not be understood narrowly as limited only to such specific examples; various modifications can be made within the spirit of the invention and the scope of claims given herebelow.

INDUSTRIAL APPLICABILITY

A full charge capacity value correction circuit, battery pack, and charging system of this invention can be used appropriately in portable personal computers, digital cameras, camcorders, portable telephones and other electronic equipment, in electric cars, hybrid cars and other vehicles, in hybrid elevators, in power systems which combine solar cells and power generation devices with secondary batteries, and in uninterruptible power supplies and other battery-mounted devices and systems.

The invention claimed is:

1. A full charge capacity value correction circuit, comprising:
   a current detection portion which detects a current value of current flowing in a secondary battery;
   a voltage detection portion which detects a terminal voltage value of the secondary battery;
   a capacity storage portion which stores a full charge capacity value indicating a full charge capacity of the secondary battery;
   a remaining quantity calculation portion which calculates, as an accumulated remaining quantity, a remaining charging quantity in the secondary battery from a total value obtained by cumulatively adding charged electrical quantities and subtracting discharged electrical quantities in the secondary battery, based on charge/discharge currents of the secondary battery detected by the current detection portion;
   a remaining quantity estimation portion which estimates, as an estimated remaining quantity, a remaining quantity of the secondary battery by using a terminal voltage value detected by the voltage detection portion; and
   a full charge capacity value correction portion which calculates, when the estimated remaining quantity estimated by the remaining quantity estimation portion becomes equal to a reference value set in advance, a difference electrical quantity, which is equivalent to a difference between the estimated remaining quantity estimated by the remaining quantity estimation portion and the accumulated remaining quantity calculated by the remaining quantity calculation portion, and performs correction, in a case where the estimated remaining quantity is greater than the accumulated remaining quantity, by adding the difference electrical quantity to the full charge capacity value stored in the capacity storage portion, but in a case where the estimated remaining quantity is less than the accumulated remaining quantity, by subtracting the difference electrical quantity from the full charge capacity value stored in the capacity storage portion,
   wherein the remaining quantity calculation portion uses, when the estimated remaining quantity becomes equal to the reference value, the estimated remaining quantity as a new accumulated remaining quantity to update the accumulated remaining quantity.

2. The full charge capacity value correction circuit according to claim 1, wherein the reference value is a remaining quantity in a range of charge states in which the secondary battery is not fully charged, and moreover is not completely discharged.

3. The full charge capacity value correction circuit according to claim 1, wherein the remaining quantity estimation portion estimates the estimated remaining quantity such that as a terminal voltage value detected by the voltage detection portion increases, the estimated remaining quantity becomes greater.

4. The full charge capacity value correction circuit according to claim 1, wherein the remaining quantity estimation portion estimates the estimated remaining quantity by using a terminal voltage detected by the voltage detection portion and a current value detected by the current detection portion.

5. The full charge capacity value correction circuit according to claim 4, wherein the remaining quantity estimation portion estimates the estimated remaining quantity such that as the current value in a discharge direction detected by the current detection portion decreases, the estimated remaining quantity becomes smaller.

6. The full charge capacity value correction circuit according to claim 1, further comprising a temperature detection portion which detects a temperature of the secondary battery, wherein
the remaining quantity estimation portion uses the terminal voltage detected by the voltage detection portion and the temperature detected by the temperature detection portion to estimate the estimated remaining quantity.

7. The full charge capacity value correction circuit according to claim 4, further comprising a temperature detection portion which detects a temperature of the secondary battery, wherein
the remaining quantity estimation portion uses the terminal voltage detected by the voltage detection portion, the current value detected by the current detection portion, and the temperature detected by the temperature detection portion to estimate the estimated remaining quantity.

8. The full charge capacity value correction circuit according to claim 6, wherein the remaining quantity estimation portion estimates the estimated remaining quantity such that as the temperature detected by the temperature detection portion increases, the estimated remaining quantity becomes greater.

9. The full charge capacity value correction circuit according to claim 1, further comprising:
a temperature detection portion which detects the temperature of the secondary battery; and
a table storage portion which stores a lookup table associating remaining quantity settings that are set in advance as values representing the remaining quantity charging the secondary battery, values of the current flowing in the secondary battery, and temperatures of the secondary battery with values of the terminal voltage of the secondary battery, wherein
the remaining quantity estimation portion estimates, as the estimated remaining quantity, the remaining quantity setting that is associated, by the lookup table stored in the table storage portion, with the terminal voltage detected by the voltage detection portion, the current value detected by the current detection portion, and the temperature detected by the temperature detection portion.

10. The full charge capacity value correction circuit according to claim 9, wherein
in the lookup table, the remaining quantity settings are expressed as a ratio of the charged electrical quantity of the secondary battery to the full charge capacity value of the secondary battery, and
the full charge capacity value correction portion calculates the difference electrical quantity based on the estimated remaining quantity estimated by the remaining quantity estimation portion as the ratio of the charged electrical quantity to the full charge capacity value, the full charge capacity value stored in the capacity storage portion, and the accumulated remaining quantity.

11. The full charge capacity value correction circuit according to claim 1, wherein
the reference value is a value set in advance to indicate that the remaining quantity is close to zero, and
an alarm portion is further provided, which issues an alarm when the accumulated remaining quantity calculated by the remaining quantity calculation portion becomes the reference value.

12. A battery pack, comprising:
the full charge capacity value correction circuit according to claim 1; and
the secondary battery.

13. A charging system, comprising:
the full charge capacity value correction circuit according to claim 1;
the secondary battery; and
a charging portion which charges the secondary battery.

14. The full charge capacity value correction circuit according to claim 7, wherein the remaining quantity estimation portion estimates the estimated remaining quantity such that as the temperature detected by the temperature detection portion increases, the estimated remaining quantity becomes greater.

* * * * *